US006597371B2

(12) United States Patent
Mandl

(10) Patent No.: US 6,597,371 B2
(45) Date of Patent: Jul. 22, 2003

(54) SYSTEM FOR DIGITALLY DRIVING ADDRESSABLE PIXEL MATRIX

(76) Inventor: William J. Mandl, 5429 Greenview Ct., Reno, NV (US) 89502

(*) Notice: Subject to any disclaimer, the term of this patent is extended or adjusted under 35 U.S.C. 154(b) by 0 days.

(21) Appl. No.: 10/125,953

(22) Filed: Apr. 18, 2002

(65) Prior Publication Data

US 2002/0118304 A1 Aug. 29, 2002

Related U.S. Application Data

(63) Continuation of application No. PCT/US00/28532, filed on Oct. 12, 2000.

(60) Provisional application No. 60/161,656, filed on Oct. 21, 1999.

(51) Int. Cl.[7] .......... G09G 5/10; H04N 9/12; H03M 3/00

(52) U.S. Cl. .......... 345/691; 345/90; 348/671; 348/383; 341/143

(58) Field of Search .......... 348/294, 295, 348/300, 301, 383, 384.1, 471, 472, 572, 724, 671; 345/690, 691, 692, 89, 90; 341/143

(56) References Cited

U.S. PATENT DOCUMENTS 5,062,001 A * 10/1991 Farwell et al. .......... 348/761
5,130,701 A * 7/1992 White et al. .......... 345/601
5,225,875 A * 7/1993 Shapiro et al. .......... 345/690
5,461,425 A * 10/1995 Fowler et al. .......... 250/208.1
5,589,852 A 12/1996 Thompson et al.
5,659,315 A 8/1997 Mandl
5,786,778 A * 7/1998 Adams et al. .......... 341/61
5,867,136 A 2/1999 Zimlich
5,959,598 A * 9/1999 McKnight .......... 345/87
6,239,781 B1 * 5/2001 Fujisawa .......... 345/691
6,510,252 B1 * 1/2003 Kishimoto .......... 382/252
2002/0130893 A1 * 9/2002 Okuda .......... 345/691

OTHER PUBLICATIONS

McIlrath, L.; "A Low Power, Low Noise, Ultra–Wide Dynamic Range CMOS Imager with Pixel–Parallel A/D Conversion"; 2000, IEEE Symposium on VLSI Circuits Digest of Technical Papers.*

Haurie et al.; "A Multiplier–Free Structure for 1–Bit High–Order Digital Delta–Sigma Modulators"; Aug. 1995; Proceedings of the 38th annual Symposium; vol. 2 13–16, pp. 889–892.*

* cited by examiner

*Primary Examiner*—Wendy R. Garber
*Assistant Examiner*—John M. Villecco
(74) *Attorney, Agent, or Firm*—Freilich, Hornbaker & Rosen

(57) ABSTRACT

A method and apparatus for digitally driving an addressable pixel display by modulating each pixel e.g., on or off, in short time pulses. A preferred embodiment responds to N-bit pixel words derived from a source digital file at a rate F1 for producing M-bit data streams at a rate F2 where N>M and F1<F2. Each data stream is preferably produced by an oversampling data modulator employing a delta-sigma implementation.

12 Claims, 7 Drawing Sheets

SYSTEM FOR DIGITALLY DRIVING ADDRESSABLE PIXEL MATRIX

RELATED APPLICATIONS

This application is a continuation of international application PCT/US00/28532 filed Oct. 12, 2000, which claims a priority date of Oct. 21, 1999 based on U.S. provisional application No. 60/161656.

FIELD OF THE INVENTION

This invention relates to a method and apparatus particularly suited for driving a row-column addressable pixel matrix display including, for example, analog type displays such as liquid crystal (LCD) and field emission (FED) and digital type displays such as ferro electric liquid crystal (FLD) and digital micromirror (DMD).

BACKGROUND OF THE INVENTION

Many video display devices can be considered as comprising a matrix of latent pixels each of which can be selectively illuminated to collectively form a frame image. A typical laptop computer display physically defines on the order of 25–80 pixels per inch. A frame image might typically be formed by approximately one million pixels, i.e., 1024 pixels wide×768 pixels high. Depending upon the physical persistence characteristics of each display device and the rate at which image information changes, it is generally necessary to refresh frame images at a rate of at least 60 frames per second (fps) to avoid apparent flicker. This technique of frame flashing has been and remains the dominant method of electronically displaying images for various video display applications, regardless of whether the image information is presented in digital or analog form. In either case, the video output circuitry generally produces an analog output to drive the display device, e.g., in RGB or NSTC format.

Applicant's prior U.S. Pat. Nos. 5,248,971; 5,515,046; and 5,569,315 describe a focal plane imager (or camera) which utilizes a multiplexed oversampling analog to digital modulation technique to produce an output bit stream for displaying the focal plane image on a monitor. The disclosures in these patents are, by reference, incorporated herein.

SUMMARY OF THE INVENTION

The present invention is directed to an enhanced method and apparatus for driving a pixel addressable video display which avoids frame flashing and instead modulates each display pixel, e.g., on or off, during successive short time increments. The psycho-physical response characteristic of the human eye acts as a low pass filter enabling a human observer to extract a real time flicker free apparent gray or color scale image.

Apparatus in accordance with the invention functions to drive a pixel addressable video display (preferably a row-column, i.e., X·Y display) in response to a digital image file containing X·Y N-bit pixel values. The file can be configured in any of various formats, e.g., TIF, JPG, AVI BMP, etc. In accordance with the invention, each N-bit pixel value (i.e., input word) refreshed at a frequency F1 is converted to an M-bit output pixel value at a frequency F2 where N>M and F2>F1. In a preferred exemplary embodiment, an eight (i.e., N) bit input pixel value refreshed at 60 (i.e., F1) times per second is converted to a one (i.e., M) bit output pixel value streaming at 420 (i.e., F2) bits per second. The output pixel value stream directly modulates a video display pixel. Where M=1, the display pixel is modulated between two possible states, e.g., on-off. In other embodiments, e.g., where M=3, each display pixel is modulated to define one of eight possible states.

Embodiments of the invention are particularly suited for use with video displays comprised of at least 10000 addressable pixels, e.g., X≧100, Y≧100.

Preferred embodiments of the invention utilize an oversampling data modulator to convert the sequence of N-bit words refreshed at F1 to an M-bit stream at a greater frequency. Oversampling data converters, particularly those implemented as Delta-Sigma (sometimes referred to as Sigma-Delta) loops, are widely discussed in the literature; e.g., see (1) *Oversampling Delta-Sigma Data Converters*, edited by J. C. Candy and S. C. Temes, IEEE Press and *Delta-Sigma Data Converters*, edited by S. R. Norsworthy, R. Schreiver, and S. C. Temes, IEEE Press.

The use of oversampling for digital to analog conversion for a small number of analog channels is well known. For example, in applications such as CD players, digitally coded values are sampled and regenerated at a higher rate. The high rate multibit data is then sampled by an oversampling modulator where the data is reduced in the number of bits, typically to one-bit, and the data sample rate is increased. A precise voltage is then generated from the one-bit high sample rate data with a low resolution DAC. To recover a precision analog signal, the DAC output is filtered by a low pass filter, eliminating the high frequency component, and passing the residual low frequency analog data. The use of delta-sigma converters for more than a few, e.g., up to one hundred, analog outputs is generally prohibitive since each analog output requires its own continuous filter of the data.

In a preferred embodiment of the present invention, an oversampling data modulator provides a one-bit data stream for each display pixel. Each data stream, which essentially has the form of a pulse density modulated signal, directly drives a single display pixel to pulse it either on or off to produce a real time apparent gray or color scale pixel image to the eye of an observer. The psycho-physical response of the human eye acts as a low pass filter allowing it to extract a flicker free image from the entire matrix of display pixels.

In an alternative embodiment of the invention, an oversampling data modulator is used to provide a multibit data stream (e.g. M=3) for each display pixel. Each data stream drives a single display pixel to cause it to define a particular one of $2^M$ states.

DETAILED DESCRIPTION

Figure 1:
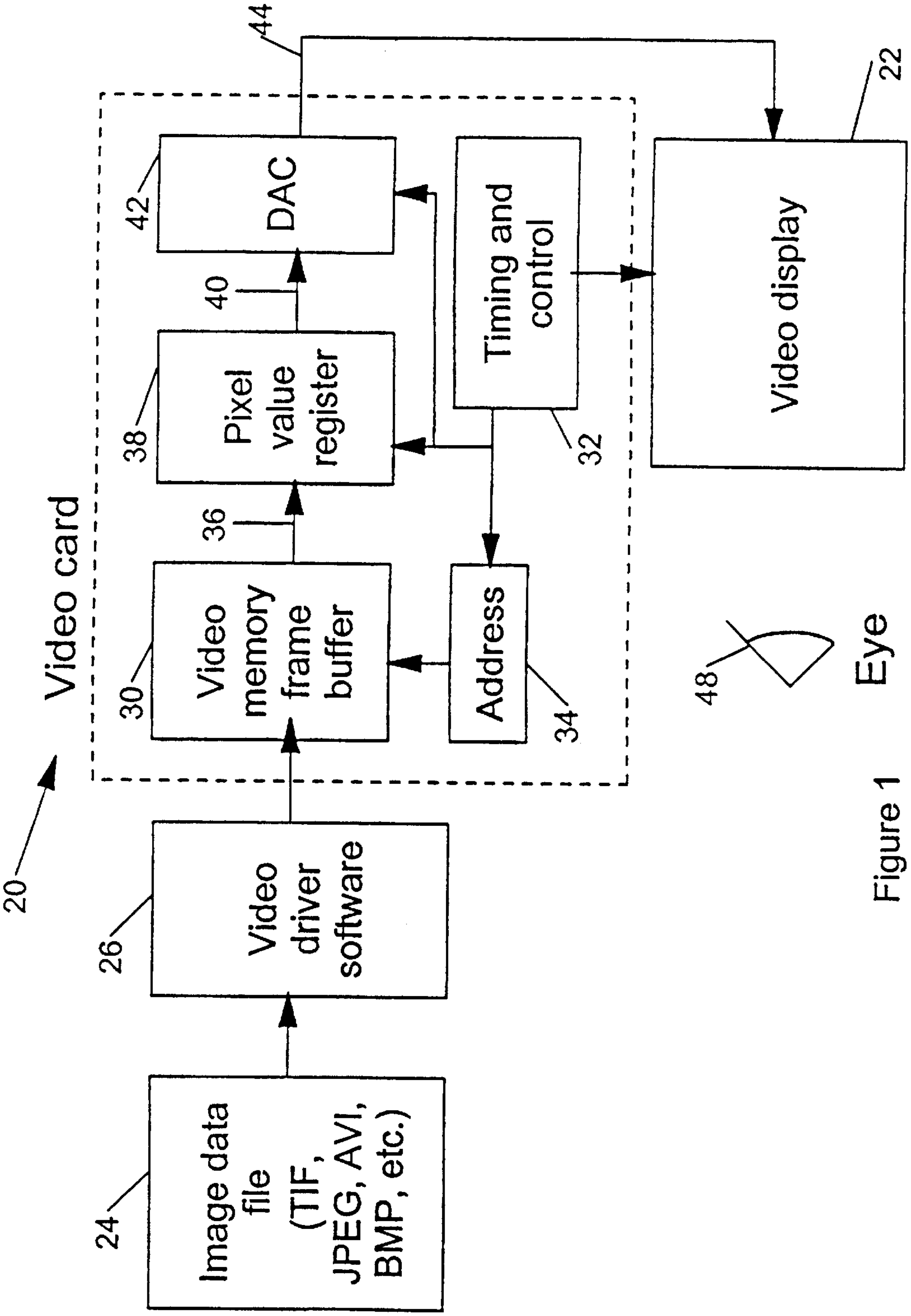
Figure 1 (Prior art)
FIG. 1 is a block diagram of a typical prior art PC video display system including a standard video card for driving a video display.

Attention is initially directed to FIG. 1 which depicts a conventional PC video display system 20 for driving a video display device 22 in accordance with digital image data derived, for example, from an image file 24 which can be presented in a wide variety of formats; e.g., TIF, JPEG, AVI, BMP, etc. The image file 24 is typically processed by video driver software 26 which periodically loads video memory frame buffer 30 with pixel data for all pixels to be represented in an image to be displayed by display device 22. The display device 22 typically comprises a raster-scan device synchronized to a timing control circuit 32. The timing control circuit 32 drives an address register 34 to access data for each sequential pixel from the frame buffer 30. Each pixel is typically represented by an N bit word which defines an apparent gray or color scale of $2^N$ steps. As an example, if N=4, the scale is comprised of 16 gray levels; if N=8, the scale is comprised of 256 gray levels, etc. Unless otherwise stated, it will be assumed herein that N=8.

Each pixel word 36 accessed from the frame buffer 30 is applied to a pixel value register 38, typically a lookup table, which transforms the digital pixel word to a digital scale value representing an intensity on a gray scale or color scale. The gray scale digital value is applied to a digital to analog converter (DAC) 42 to produce an analog output for driving video display 22. In the case of a color scale, each N bit pixel word represents one of 256 different color intensities for one of the red, green, and blue color components. Thus, the pixel value register 38 would output three separate digital color component values 40. These component values 40 are then applied to DAC 42 which produces red, green, and blue analog signals 44 for application to the video display device 22.

The video display device 22 can comprise any of a variety of pixel based devices including both light emissive and light reflective devices including, for example, cathode ray tube (CRT), ferro-electric liquid crystal (FLD), field emission (FED), and digital micromirror display (DMD). The dominant method of operating these and analogous display devices is based on a frame flashing methodology which typically requires that the display be refreshed or flashed at a rate F1 of at least 60 flashes per second (fps). A lesser rate is likely to produce eye-irritating flicker to an observer 48. In order to refresh the display 22 at rate F1, the timing control circuit 32 must cause the frame buffer 30 to transfer an N bit word for each pixel to the pixel value register 38 at the rate F1. The DAC 42 in turn supplies an analog (8 bit equivalent) signal to display device 22 at the rate F1.

Figure 2:
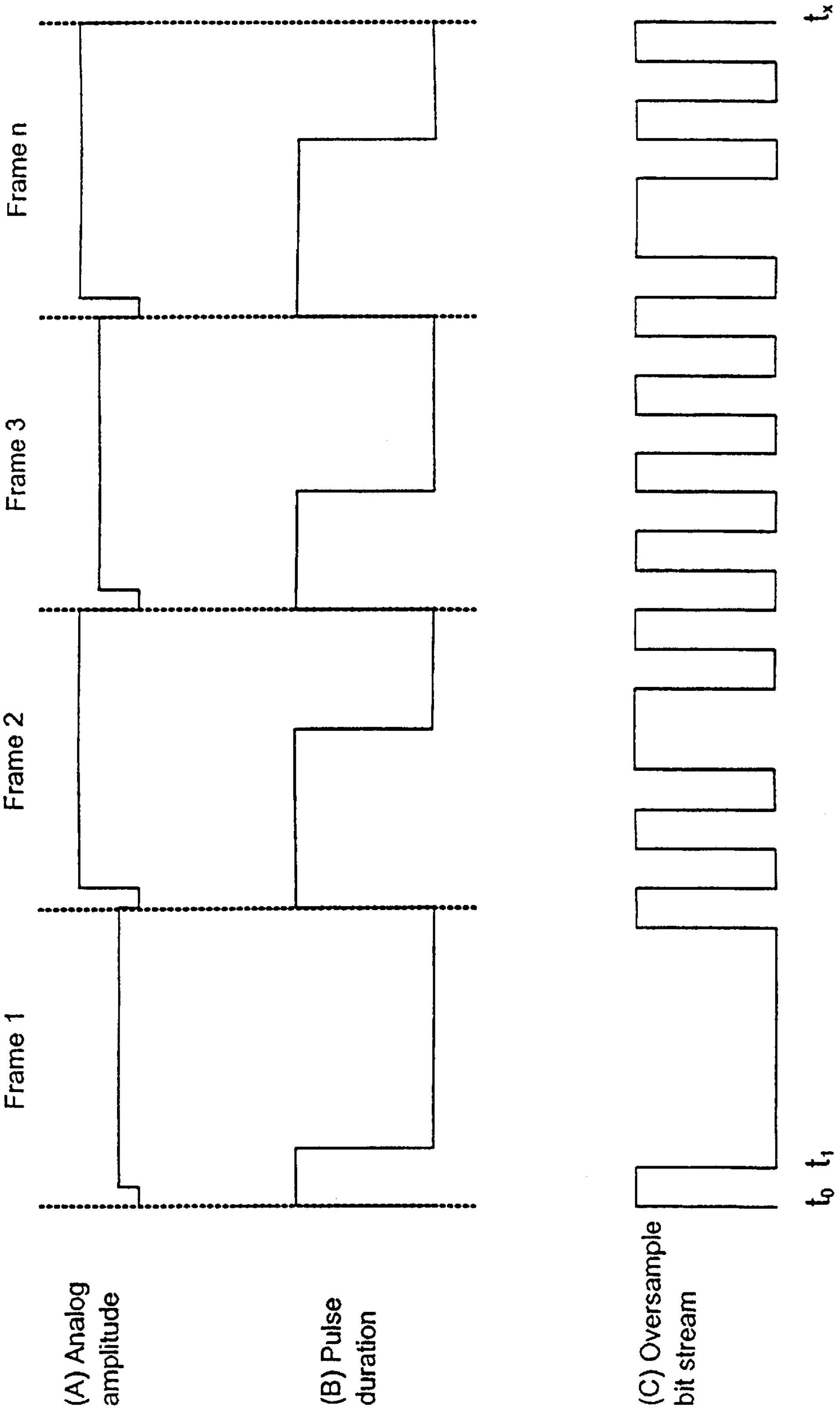
FIG. 2 lines A and B respectively represent conventional wave forms for driving a single display pixel and line C represents a wave form for driving a single display pixel in accordance with the present invention.

Lines A and B of FIG. 2 schematically depict two different analog techniques for modulating the intensity value of a single display pixel during frames 1, 2, 3 and N. The frame rate will be assumed to be 60 per second to avoid flicker. In line A, intensity is represented by a variable signal amplitude. Where an eight bit dynamic range is desired, it is necessary to be able to define 256 distinguishable amplitude levels. This technique is subject to gamma error attributable to nonlinear amplitude response.

Line B represents intensity values by pulse duration modulation. As depicted, line B represents the intensity during each frame by the variable width of a single pulse. Alternatively, an equivalent pulse duration can be formed by multiple pulses of variable duration. Regardless, this technique requires that the system be able to place a pulse edge at 256 distinguishable positions during each frame to achieve an eight bit dynamic range.

Line C, to be discussed hereinafter, depicts an oversample bit stream generated in accordance with the present invention for modulating a single pixel on and off. In contrast to lines A and B, the bit stream of line C does not define an intensity value during each successive frame to refresh the pixel. Rather, the bit stream modulates the pixel, preferably on-off, so that the bit density, as integrated by the eye, creates the desired pixel gray or color scale intensity.

Applicant's aforementioned patents describe a focal plane analog to digital conversion technique for capturing and displaying images. The technique uses a multiplexed oversampled analog to digital converter placed at each pixel position on the focal plane. It is preferably implemented by a one-bit converter configured as a Delta-Sigma circuit. The modulator portion of the Delta-Sigma circuit, which includes the integrators and subtraction electronics is preferably placed at the pixel focal plane. Each pixel modulator is individually sampled onto a multiplexing column where they are quantized and transmitted off focal plane as a one-bit digital bit stream. It has been the convention with Delta-Sigma circuits to decimate the oversample bit stream of the modulator down to the Nyquist sample rate and convert it to a pulse code modulated, PCM, multi-bit binary word. The number of bits in this word represents the measured signal at the required Nyquist sample rate.

The present invention is based on the recognition that this oversample bit stream can be advantageously used to directly drive a single display pixel and that such streams can drive X·Y pixel addressable video display to produce a composite video image. More specifically, each bit stream can drive a single pixel to turn it either on or off while relying on the persistence and relatively slow response of the human eye to cause the pixel to appear as a gray level. This recognition enables an X·Y pixel addressable video display to be driven by fully digitally implemented circuitry. This approach provides simplicity in electronics by eliminating the need for analog processing.

The use of an oversample bit stream to modulate a pixel offers improvement in display quality as compared to existing analog and alternate digital approaches. The key areas of improvement are linearity, bandwidth and dynamic range. Analog displays such as cathode ray tubes (CRT) and field emission displays (FED), typically exhibit a non-linear intensity response to an applied analog signal voltage that varies for different displays. To correct for this, the display manufacturer typically measures the response and develops a gamma correction curve which is applied to improve linearity. In contrast, a system in accordance with the invention can turn the display pixels fully on or off, (where M=1) depending on the on/off timepulse density to produce an average intensity variation. This avoids the typically nonlinear characteristic of an analog value.

It has been experientially determined that to produce a flickerless response with eight bits dynamic range, a system in accordance with the invention should pulse each pixel at a frequency in the range of 250–700 Hz, e.g., 420 pulses per second per pixel. To achieve this pulse rate, an analog CRT would have to increase its raster scan rate to 420 frames per second, fps. However, though frame rate increases, the bandwidth of the data on the electron guns is actually lowered. At a nominal 60 fps for flicker free display, an analog display must have 336 Hz information bandwidth per pixel, equivalent to about 480 bits per second. This is also true for digital displays that use pulse width modulated input video data. For digital displays that are pulse width modulated, the bandwidth problem is even more severe. These displays must divide the frame interval into 256 time intervals (FIG. 2B) to provide eight bits of gray scale. At 60 fps, this requires 15,360 switches per second, i.e., a 65 microsecond time interval. This is considerably higher than is required by systems in accordance with this invention. Dynamic range limitation is the most severe problem for modern displays because of these timing requirements. Newer video displays such as ferro-electric liquid crystal (FLD) and digital micromirror device (DMD) do not generally achieve the dynamic range they are theoretically capable of due to the pulse width modulation schemes used to drive them. For example, an FLD seldom achieves better than 500 microsecond frame update times. Dividing this time into a 60 fps display rate allows 33 time increments per frame for gray values or of five bit dynamic range. Systems in accordance with the invention operating at this switch rate, i.e., 2,000 pulses per second, will provide greater dynamic range at the video display, e.g., up to 10 bits.

Line A of FIG. 2 represents an analog amplitude modulated signal subject to nonlinearity error. Line B of FIG. 2 represents a pulse duration modulated approach. Even though only one edge transition is shown for each frame, its position is independent for all pixels thus requiring frame updates at all allowable positions. Line C depicts a one-bit pulse density data stream in accordance with the present invention. Whereas large amplitude harmonics at 60 Hz exist in the frame approaches, i.e. FIG. 2, lines A, B, a system in accordance with line C reduces these harmonics or pushes them up in frequency above the eye response. The number of switching transitions is also typically much greater in line C thus reducing incoherent noise due to clock jitter. Line C depicts edge times $t_0$, $t_1$ and $t_x$. The interval $t_0$–$t_1$ represents the shortest bit stream interval for turning a pixel on and then off. Lines A and B depict a sequence of n frames which are assumed to occur at F1=60 frames per second. To produce 420 pulses per second (F2) in accordance with the bit stream of line C, edge time $t_x$ occurs substantially at (F2/F1)n.

Figure 3:
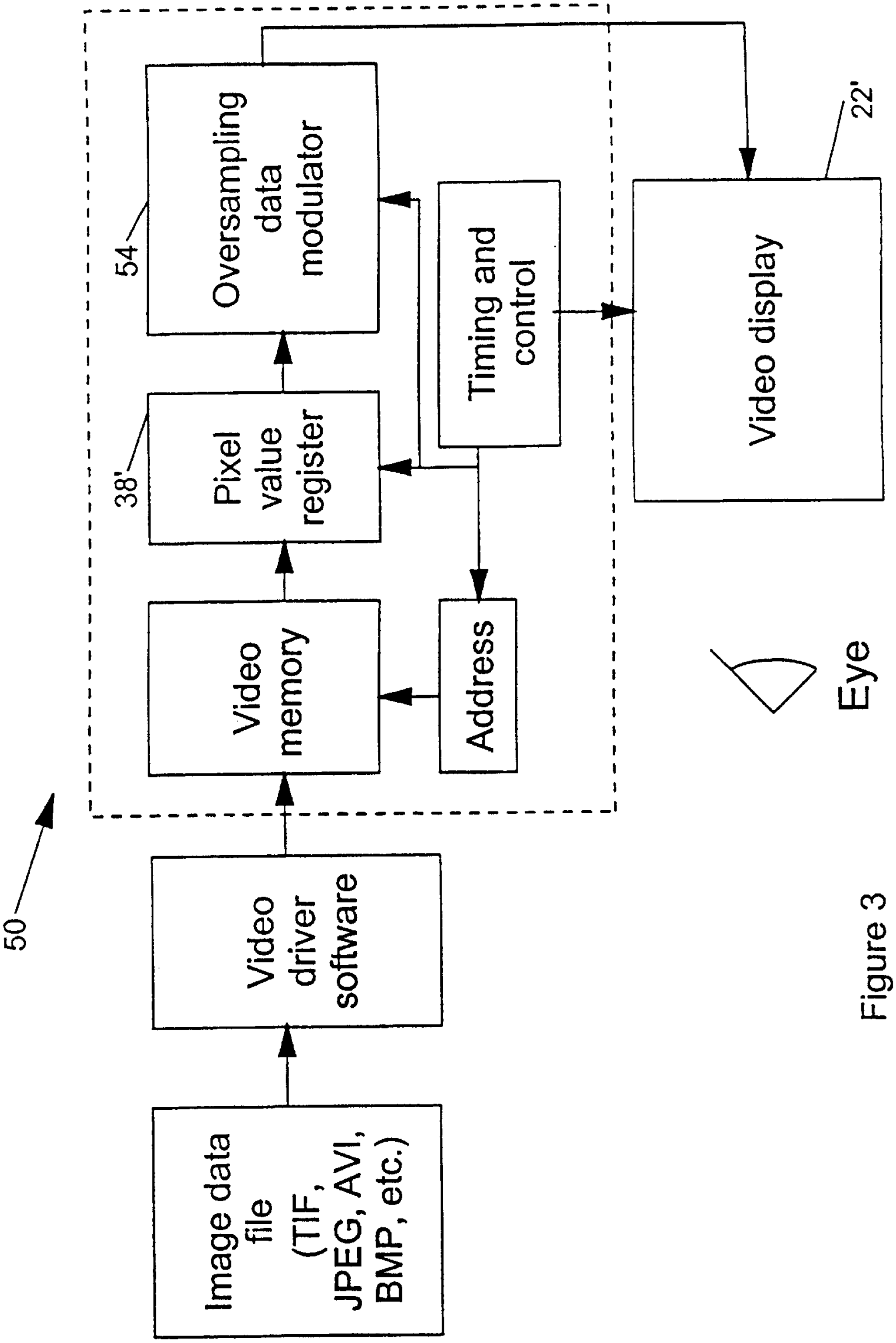
FIG. 3 is a block diagram of a PC video display system in accordance with the present invention utilizing an oversampling data modulator for driving the video display.
Figure 4A:
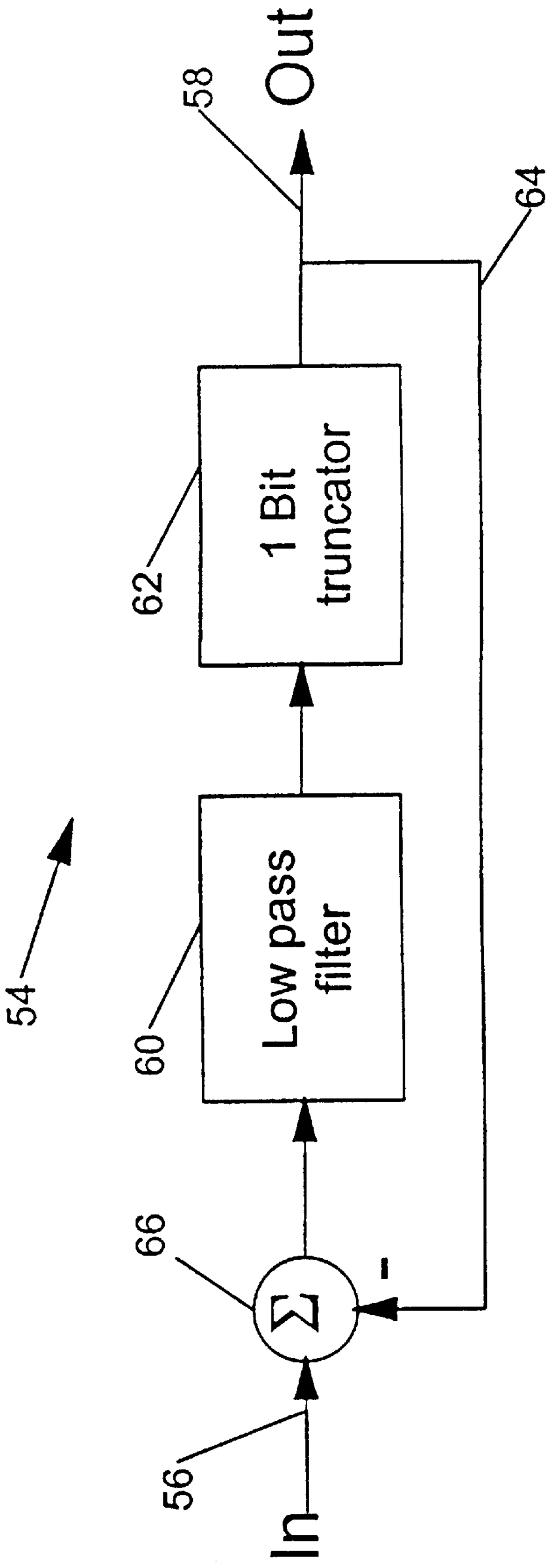
FIG. 4A is a generalized block diagram of an oversampling data modulator and FIG. 4B shows a simple implementation of the data modulator.

Attention is now directed to FIG. 3 which illustrates a video display system 50 in accordance with the present invention. The system 50 differs from the system 20 of FIG. 1 primarily in that DAC 42 has been eliminated and instead an oversampling data modulator 54 has been introduced between the pixel value register 38' and the video display 22'. A single loop oversampling data modulator 54 is generally represented in FIG. 4A and is discussed in the aforementioned literature. Its function is to sample a quantized input signal 56 (in our case, an N bit digital pixel value) at a first rate F1 to produce a truncated short word length output 58 (in our case, an M-bit word where M is preferable one) at a higher sample rate F2. The generalized oversampling data modulator of FIG. 4A is comprised of a low pass filter 60, a one-bit truncator 62, and a single feedback loop 64 to feed back the truncator overflow to a summer 66 for subtraction from the input 56.

Figure 4B:
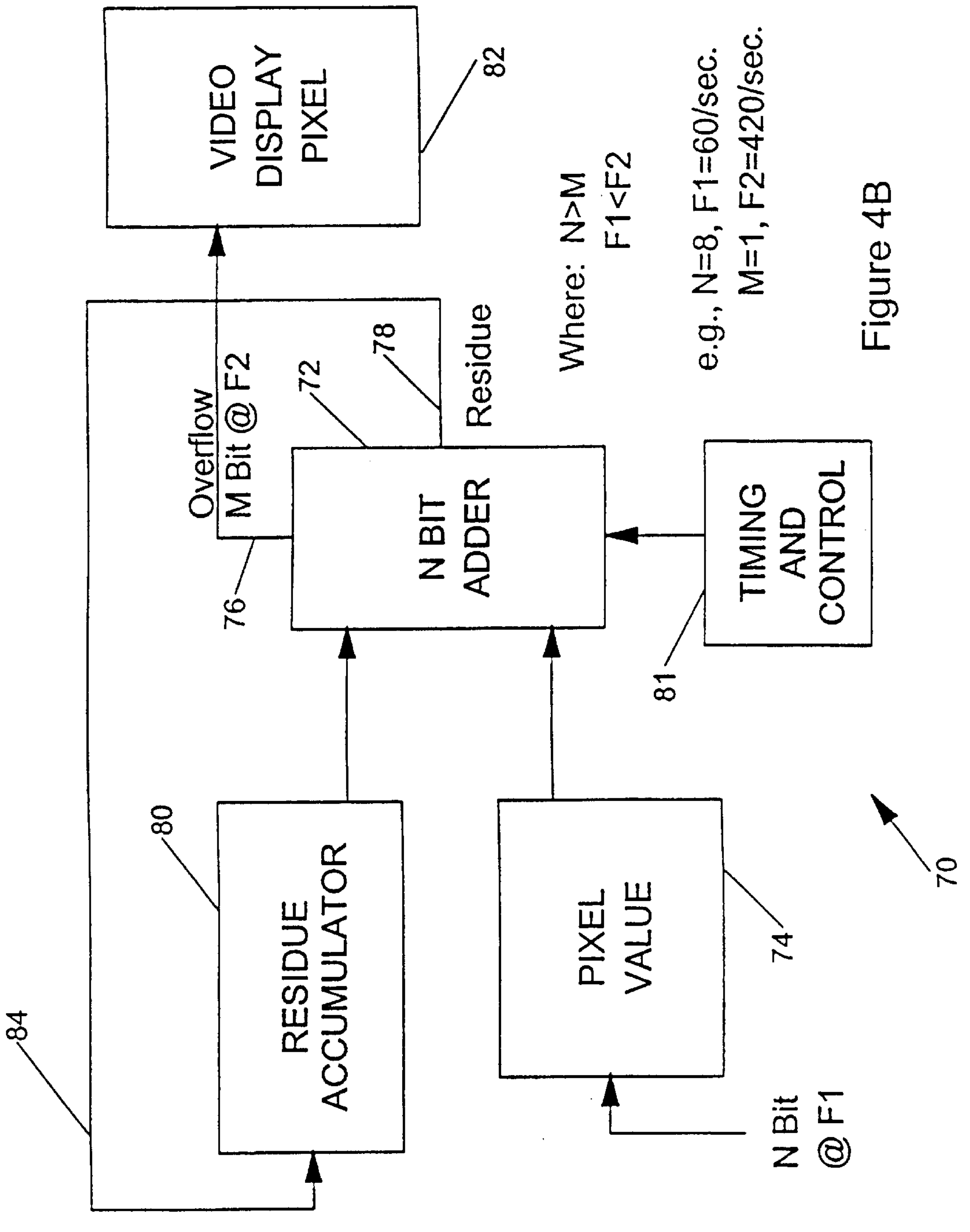

FIG. 4B illustrates an exemplary implementation 70 of the oversampling data modulator 54 of FIG. 3. It includes an N-bit adder 72 having first and second inputs. The first input accepts N-bit pixel values from a pixel value register 74 which is refreshed at a rate F1. The output of adder 72 is comprised of an overflow component 76 and residue component 78. The residue component 78 is supplied to an N-bit accumulator 80 via a feedback loop 84. The output from accumulator 80 is supplied to the second input of adder 72. The adder 72 is controlled by timing and control circuit 81 to produce an M-bit output at a rate F2. More particularly, overflow 76 from adder 72 comprises an M (preferably, one) bit data stream which is used to directly drive a video display pixel 82. The circuit 81 controls the adder 72 to convert the N-bit input words refreshed at F1 to an M-bit output stream at rate F2 where, for example, N=8, F1=60/second and M=1, F2=420/second.

The description of the preferred embodiment thus far has primarily been with respect to a single pixel. Obviously, a practical video display system must operate on images containing on the order of tens of thousands to over a million pixels. This can be readily implemented by utilizing a multiplicity of oversampling data modulators and/or time sharing the data modulators.

Figure 5:
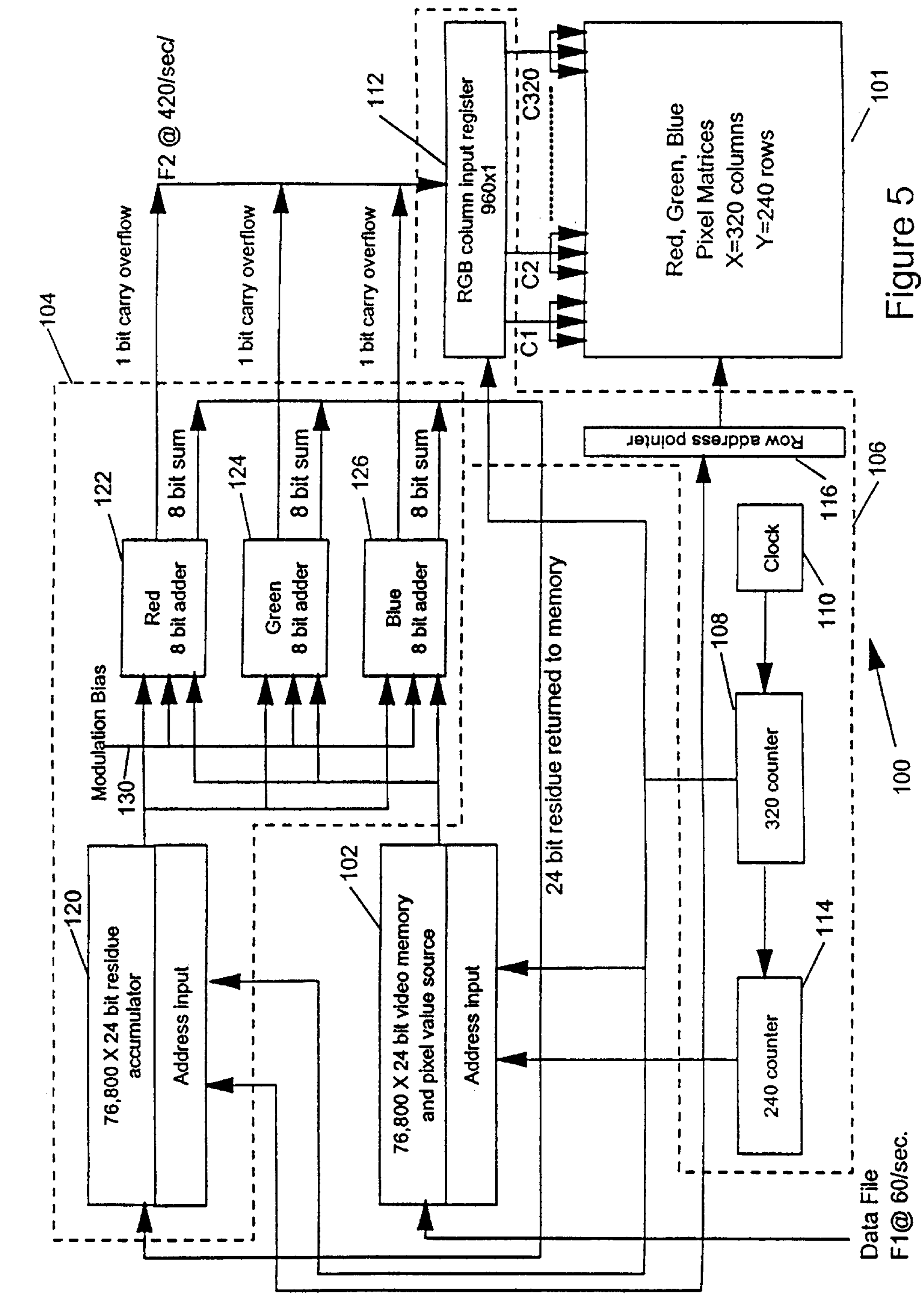
FIG. 5 is a block diagram of a three color video display system in accordance with the present invention including a video display comprised of X·Y addressable pixels and an oversampling data modulator for generating separate one-bit data streams to modulate each display pixel color component.

Attention is now directed to FIG. 5 which depicts a complete video display system 100 in accordance with the invention comprised of an array or matrix of X·Y addressable video display pixels 101, a video memory 102, an oversampling data modulator 104, and addressing and timing control circuitry 106. To facilitate explanation, it will be assumed that display 101 is comprised of 76,800 pixels arranged in X=320 columns and Y=240 rows. Each of the 76,800 display pixels will be assumed to be comprised of separate red, green and blue pixel components or, in other words, display 101 can be viewed as being comprised of separate red, green, and blue matrices each including X·Y pixels with the three matrices being driven by common address and timing circuitry. The video memory 102 is shown as storing an image data file including 76,800 N-bit pixel words where N=24. Each 24-bit word is comprised of three 8-bit fields respectively defining the values for the red, green and blue components of a pixel. It will initially be assumed that display 101 is of the type which permits all of the pixels in a single row to be modulated simultaneously. The aforementioned FLD, FED, and DMD displays are exemplary of this type and contrast with a raster scan type display, typically a CRT.

Control circuitry 106 is comprised of a column counter 108 which defines a 320 count cycle in response to timing pulses supplied by clock circuit 110. Each count of counter 108 to used to gate a different 3 bit pixel value set (i.e., red, green, blue components) generated by modulator 104 into column input register 112, which is preferably configured as a 960 bit shift register.

Control circuitry 106 also includes a row counter 114 which defines a 240 count cycle and is incremented once per cycle of column counter 108. The row counter 114, via row address pointer 116, selects the display pixel row to be modulated. When a pixel row is selected, all of the pixels in that row are modulated in parallel in accordance with the data available in column input register 112. The pixel data is loaded into register 112 from modulator 104 at a rate sufficient to modulate every pixel in display 101 at the aforediscussed rate F2, preferably at least 420 times per second.

Data modulator 104 is comprised of residue accumulator 120 (which functionally corresponds to accumulator 80 of FIG. 4B) and red, green, and blue component adders 122, 124, 126 (which functionally correspond to adder 72 of FIG. 4B). As with video memory 102, residue accumulator 120, stores a 24-bit word for each of the 76,800 pixels in display 101. The video memory 102 and residue accumulator 120 are preferably identically addressed by addressing circuitry 106 to simultaneously access data for the same display pixel set (i.e., red, green, blue components).

The data modulator 104 operates essentially the same as the data modulator of FIG. 4B. Sequentially, for each display pixel, 24-bit pixel data is accessed from both video memory 102 and residue accumulator 120 and applied to component adders 122, 124, 126. Each component adder produces an 8-bit sum and a 1-bit overflow. The 1-bit overflows are loaded into column input register 112. The 8 bit sums are fed back and stored in residue accumulator 120.

The column input register 112 is preferably sufficiently long to store pixel modulation data for a full pixel row, i.e., 320 pixels each having 3 color component bits, to enable an entire row of display pixels, to be simultaneously modulated. Alternatively, if a raster scan display is used, the display pixels are modulated sequentially along a row.

In the preferred operation of the display system 100, the data file stored in video memory 102 is refreshed, e.g., from a host computer, at a rate F1, which is typically between 20–60 Hz but which will be assumed for purposes of explanation herein to be at 60 Hz. Between successive refresh times, the addressing circuitry 106 completes at least seven successive modulation cycles of display 101 thus modulating each pixel at a rate F2 of 420 times per second. During each modulation cycle, the addressing circuitry 106 sequentially steps through 76,800 pixel positions enabling the modulator 104 to generate a one-bit overflow from each of the component adders for each pixel position. The column input register 112 is fully loaded from the overflow outputs of the component adders 240 times during each modulation cycle, thus enabling all 240 display pixel rows to be modulated during each modulation cycle.

Figure 6:
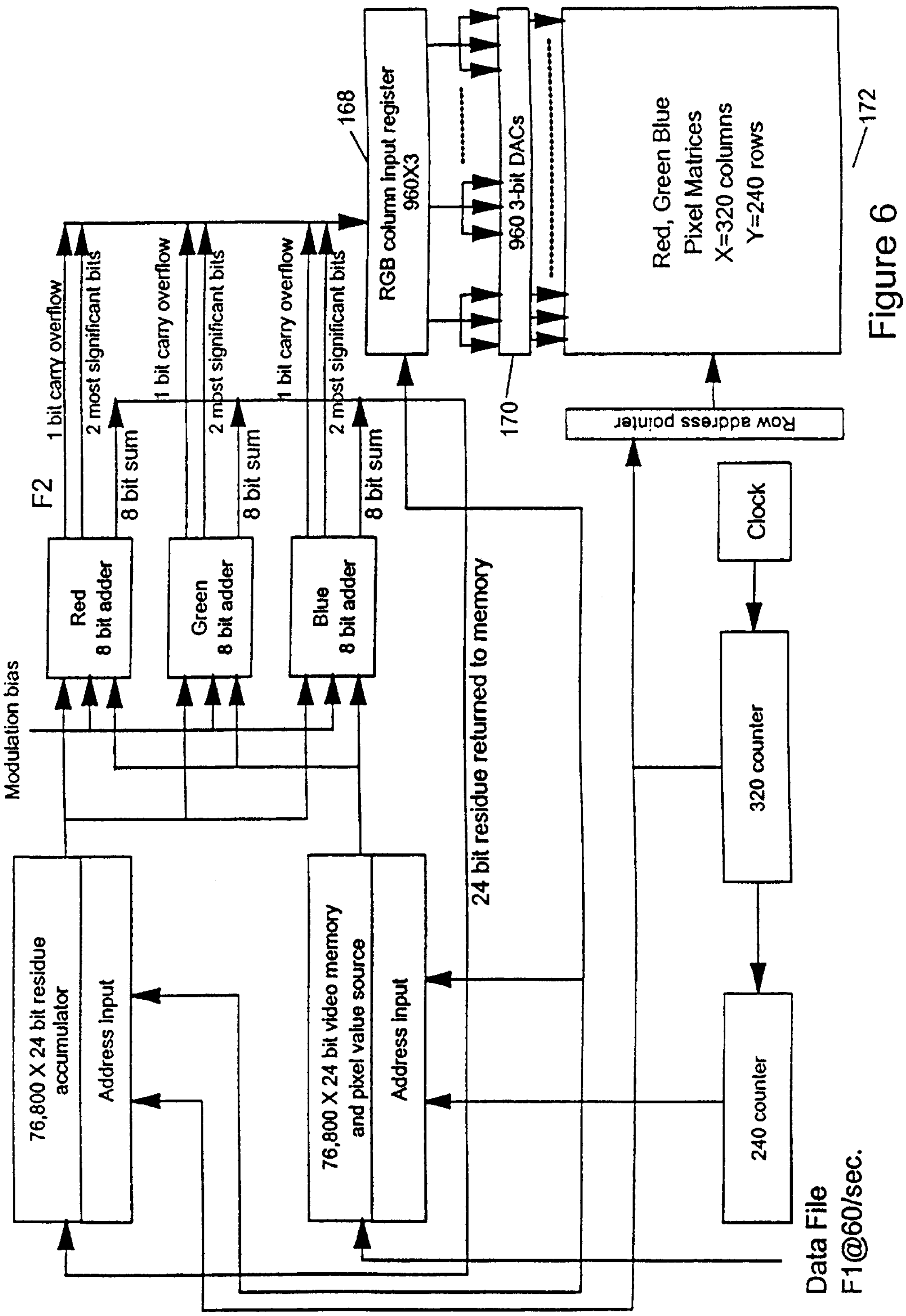
FIG. 6 is a block diagram similar to FIG. 5 but wherein the data modulator is configured to provide a three bit data stream for each display pixel color component.

In the embodiment thus far described, it has generally been assumed that an input word of N-bits (per color component) is refreshed at a rate F1, where N=8 and F1=60 Hz, to produce an M-bit output stream at F2, where M=1 and F2=420 Hz, for modulating a display pixel. Where M=1, the display pixel is modulated between only two possible states, i.e., on or off, thereby permitting a relatively simple display implementation. It should be understood however that the present invention is not restricted to embodiments where M=1. Thus, for example, FIG. 6 depicts an embodiment similar to FIG. 5, except however, it contemplates deriving three bits (i.e., M=3) from each component adder, e.g., the overflow and the two most significant sum bits. The M-bit outputs from the red, green and blue adders are stored in column input register 168 which can be implemented as a 960×3 shift register. The content of the register 168 is transferred, preferably in parallel, to a bank of DAC's 170 which produce analog outputs for modulating the intensity of pixels in display 172. More particularly, for each display pixel row, 960×3-bit values are transferred, preferably in parallel, to the DAC bank 170. Each 3-bit value defines the intensity for a particular color component of a particular display pixel. Each such 3-bit value (i.e., M=3) is able to define $2^M$ or eight possible intensity levels for each pixel component.

In FIG. 6, it is assumed that the video memory is refreshed at F1=60/second. The M-bit words produced by the adders and the resulting analog signals produced by DAC's of bank 170 have been assumed to occur at F2 where F1<F2. It has been experientially determined that for M=1, F2 can appropriately be 420/second. For M>1, it is appropriate that F2 be set to a rate less than 420/second.

From the foregoing, the structure and operation of embodiments of the invention should be readily appreciated. The essential reason as to why embodiments, as described, provide high quality displays is in part attributable to the time response characteristics of the human eye to a unit pulse of light. These characteristics enable flicker free displays to be produced by modulating pixels at a sufficient rate; e.g., on and off at a 420 per second rate. Because each gray scale pixel or color component pixel requires only one-bit at this 420 per second rate, the overall band width requirements are reduced as contrasted with alterative video display systems.

The characteristics of the human eye can cause artifacts which appear as noise when an on/off pulse density data stream is used to create apparent gray levels. The eye has a known time response curve that generally follows the equation, $$f(t)=t/(t+0.2)$$

where t is time in seconds and f(t) is the response to a unit increase in light intensity. This equation shows the behavior to be equivalent to a low pass filter with a very broad roll off. For a pulse density modulated data stream, if the modulation rate is sufficiently high, the modulation carrier frequency will be filtered out passing only the modulating information. However, at very low pulse densities, an individual pulse is perceived as a pulse of light rather than an average value of pulse density as the above equation would predict. Depending on light intensity, this break down generally becomes noticeable at about 20 pulses per second. If a modulation bias is added into the pulse density stream as shown at 130 in FIG. 5 such that the lowest pulse rate will be above 20 pulses per second, then individual pulses will not be observable. Since the eye perceives black and white as relative values this can be done without changing the perception of various shades of gray from black to white. Black will be seen at the 20 light pulses per second intensity rather than zero light intensity.

The noise frequency distribution in the pulse data will also affect the number of gray levels that are perceived. In classical oversample theory, the noise performance of a two loop delta sigma modulator is predicted to be better than a one loop modulator and a three loop better than a two loop. In these predicted performances, the filter is considered to be an ideal low pass filter. That is, frequencies in the pass band are not attenuated and frequencies above the pass band are attenuated to zero. The broad roll off of the eye does not precisely conform to the ideal filter. Though in classical theory, multiloop delta sigma modulators create less noise in the pass band, they increase noise in the above band region. The eye responds over a wider band in such a way that multiloop modulators may actually appear to be noisier than single loop modulators.

The embodiments described herein are exemplary. It is recognized that various modifications and extensions will readily occur to those skilled in the art which fall within the spirit and intended scope of the invention as expressed in the appended claims. Moreover, it should be readily appreciated that many of the aforementioned quantitative parameters have been mentioned primarily to facilitate a conceptual understanding of the invention and should not be taken in a limiting sense.

What is claimed is:

1. Apparatus responsive to a digital file containing X·Y N-bit words, each N-bit word uniquely defining one of $2^N$ pixel values, for forming a gray or color scale image on a matrix of X·Y addressable pixels where X·Y≧10000, said apparatus comprising:

a pixel value source supplying each of said N-bit words at a rate F1;

an oversampling data modulator;

said data modulator being responsive to each supplied N-bit word for producing an output stream of M-bit words, each M-bit word uniquely defining one of $2^M$ pixel intensity levels, at a rate F2 where N>M and F1<F2;

means applying each such output stream to an associated one of said addressable pixels such that each output stream directly modulates its associated pixel to produce a light output which can be readily filtered by a human eye to extract an apparent gray or color scale image;

said data modulator comprising an accumulator;

an adder for adding each supplied N-bit word to an associated residue stored in said accumulator to produce a sum and an M-bit word;

a feedback path for adding each produced sum to the associated residue stored in said accumulator; and wherein each of said output streams is formed by said produced M-bit words.

2. The apparatus of claim 1 wherein M=1 and F2>250 Hz.

3. The apparatus of claim 1 wherein said data modulator is configured to produce X·Y different M-bit word output streams each derived from a different one of said X·Y N-bit pixel values; and wherein each different output stream modulates a different one of said addressable pixels.

4. The apparatus of claim 3 wherein M=1 and occurs at a rate F2 greater than 350 Hz.

5. The apparatus of claim 4 wherein each of said addressable pixels defines either a first on state or a second off state; and wherein each of said output streams functions to switch one of said addressable pixels between said on and off states.

6. The apparatus of claim 3 wherein each of said output streams is defined by a variable pulse density signal.

7. The apparatus of claim 1 wherein said matrix of addressable pixels includes pixels of a first color; and further including second and third matrices of addressable pixels respectively of second and third colors.

8. Apparatus for driving a display comprised of X·Y pixels, where X·Y≧10000, to create a visible gray or color scale image, said apparatus comprising:

an image file including X·Y N-bit input words each uniquely associated with a different one of said X·Y pixels and each uniquely defining one of $2^N$ pixel values, said image file being refreshed at a rate F1;

an oversampling data modulator;

said data modulator being operable to derive from each N-bit input word, an M-bit output word uniquely defining one of $2^M$ pixel intensity levels at a rate F2 where N>M and F1<F2; and means applying each M-bit output word pixel value to the display pixel associated with the N-bit input word from which it was derived to directly modulate the light output of the pixel for filtering by a human eye to extract an apparent gray or color scale image;

said data modulator comprising an accumulator;

an adder for adding each supplied N-bit input word to an associated residue stored in said accumulator to produce a sum and an M-bit output word;

a feedback path for adding each produced sum to the associated residue stored in said accumulator; and wherein each of said output streams is formed by said produced M-bit output words.

9. The apparatus of claim 8 further including a video memory for storing said image file; and a residue memory for storing residue components produced by said adder.

10. A method of directly modulating each pixel in a matrix of X·Y addressable pixels, where X·Y≧10000, to form a visible gray or color scale image, said method comprising the steps of:

supplying X·Y N-bit words, each N-bit word uniquely defining one of $2^N$ pixel values and each uniquely associated with a different one of said X·Y pixels, at a rate of F1;

converting each of said N-bit words to a stream of M-bit words output each M-bit output word uniquely defining one of $2^M$ pixel intensity levels at a rate of F2 where N>M and F1<F2, said converting step including adding each supplied N-bit word to a previously accumulated residue for the corresponding addressable pixel to produce a sum and an M-bit output word;

directly modulating each addressable pixel by a different one of said streams of M-bit output words to vary the light output therefrom; and relying on the psycho-physical response of the human eye to low pass filter the light output to extract an apparent flicker free gray or color scale image.

11. The method of claim 10 wherein said step of converting causes each N-bit word to be converted to a stream of one-bit values occurring at a rate>250 per second.

12. The method of claim 11 wherein said addressable pixels are binary; and wherein said step of modulating involves turning an addressable pixel either on or off.

* * * * *